(12) United States Patent
Kusuda (10) Patent No.: US 11,251,760 B2
(45) Date of Patent: Feb. 15, 2022

(54) AMPLIFIERS WITH WIDE INPUT RANGE AND LOW INPUT CAPACITANCE

(71) Applicant: Analog Devices, Inc., Norwood, MA (US)

(72) Inventor: Yoshinori Kusuda, San Jose, CA (US)

(73) Assignee: Analog Devices, Inc., Norwood, MA (US)

( * ) Notice: Subject to any disclaimer, the term of this patent is extended or adjusted under 35 U.S.C. 154(b) by 0 days.

(21) Appl. No.: 15/929,756

(22) Filed: May 20, 2020

(65) Prior Publication Data

US 2021/0367572 A1  Nov. 25, 2021

(51) Int. Cl.
*H03F 3/45* (2006.01)
*H03F 1/02* (2006.01)

(52) U.S. Cl.
CPC ..... *H03F 3/45197* (2013.01); *H03F 3/45224* (2013.01); *H03F 3/45479* (2013.01)

(58) Field of Classification Search
CPC ............ H03F 3/45197; H03F 3/45224; H03F 3/45479
USPC ................................................ 330/252–261
See application file for complete search history.

(56) References Cited

U.S. PATENT DOCUMENTS

| | | | |
|---|---|---|---|
| 4,887,048 A | 12/1989 | Krenik et al. | |
| 5,384,548 A | 1/1995 | Sakurai et al. | |
| 5,548,227 A | 8/1996 | Minami | |
| 5,796,300 A | 8/1998 | Morgan | |
| 6,194,962 B1 | 2/2001 | Chen | |
| 6,380,801 B1 | 4/2002 | McCartney | |
| 6,734,723 B2 | 5/2004 | Huijsing | |

(Continued)

FOREIGN PATENT DOCUMENTS

| | | |
|---|---|---|
| CN | 100472957 C | 8/2005 |
| DE | 102013107414 A1 | 1/2014 |

(Continued)

OTHER PUBLICATIONS

Datasheet for Analog Devices AD8657, 18V, Precision, Micropower CMOS RRIO Operational Amplifier, Mar. 2011, 24 pages.

(Continued)

*Primary Examiner* — Hieu P Nguyen
(74) *Attorney, Agent, or Firm* — Knobbe, Martens, Olson & Bear, LLP (57) ABSTRACT

Amplifiers with wide input range and low input capacitance are provided. In certain embodiments, an amplifier input stage includes a pair of input terminals, a pair of n-type input transistors, a first pair of isolation switches connected between the input terminals and the n-type input transistors, a pair of p-type input transistors, and a second pair of isolation switches connected between the input terminals and the p-type input transistors. The amplifier input stage further includes a control circuit that determines whether to use the n-type input transistors and/or the p-type input transistors for amplification based on a detected common-mode voltage of the input terminals. The control circuit opens the first pair of isolation switches to decouple the input terminals from the n-type input transistors when unused, and opens the second pair of isolation switches to decouple the input terminals from the p-type input transistors when unused.

20 Claims, 9 Drawing Sheets

(56) References Cited

U.S. PATENT DOCUMENTS

| | | |
|---|---|---|
| 7,023,266 B2 | 4/2006 | Chung |
| 7,042,289 B2 | 5/2006 | Hwang et al. |
| 7,068,095 B2 | 6/2006 | Bernardon |
| 7,126,596 B1 | 10/2006 | Hogan |
| 7,187,236 B2 | 3/2007 | Britton, Jr. et al. |
| 7,248,115 B2 | 7/2007 | Nishimura |
| 7,321,260 B2 | 1/2008 | Larson |
| 7,330,074 B2 | 2/2008 | Kang et al. |
| 7,375,585 B2 | 5/2008 | Trifonov et al. |
| 7,408,406 B2 | 8/2008 | Hickman |
| 7,443,239 B2 * | 10/2008 | Tsuchi ............... H03F 3/45233 330/253 |
| 7,564,270 B1 | 7/2009 | Zhang et al. |
| 7,671,677 B2 | 3/2010 | Kindt et al. |
| 7,706,480 B2 | 4/2010 | Stojanovic |
| 7,852,252 B2 | 12/2010 | Ge |
| 7,920,025 B2 * | 4/2011 | Nishimura .......... H03F 3/45744 330/255 |
| 8,253,470 B2 | 8/2012 | Mulder |
| 8,330,537 B1 | 12/2012 | Ghorpade et al. |
| 8,428,196 B2 | 4/2013 | Stojanovic |
| 8,624,668 B2 | 1/2014 | Wan |
| 8,633,770 B2 | 1/2014 | Danioni |
| 8,773,174 B2 | 7/2014 | Wang et al. |
| 8,854,135 B2 | 10/2014 | Cuenca et al. |
| 8,908,778 B2 | 12/2014 | Chung et al. |
| 8,988,402 B2 | 3/2015 | Tsuchi |
| 9,306,509 B2 | 4/2016 | Lim et al. |
| 9,312,825 B2 | 4/2016 | Maurino |
| 9,564,855 B2 | 2/2017 | Mora-puchalt |
| 10,116,268 B2 | 10/2018 | Vijaykumar et al. |
| 10,476,457 B2 | 11/2019 | Schober et al. |
| 2002/0135424 A1 | 9/2002 | Oikawa |
| 2007/0159248 A1 | 7/2007 | Tsuchi |
| 2008/0284507 A1 | 11/2008 | Pertijs et al. |
| 2012/0032944 A1 | 2/2012 | Kojima |
| 2013/0021101 A1 | 1/2013 | Frey |
| 2013/0069720 A1 | 3/2013 | Reisiger |
| 2014/0022014 A1 | 1/2014 | Reisiger |
| 2015/0288336 A1 | 10/2015 | Kusuda |
| 2019/0140607 A1 | 5/2019 | Otani |

FOREIGN PATENT DOCUMENTS

| | | |
|---|---|---|
| DE | 102013018076 B4 | 5/2015 |
| KR | 100842405 B1 | 7/2008 |
| WO | WO 2015/013023 A2 | 1/2015 |

OTHER PUBLICATIONS

De Langen et al., "Compact Low-Voltage Power-Efficient Operational Amplifier Cells for VLSI" IEEE Journal of Solid-State Circuits, vol. 33, No. 10, Oct. 1998 in 15 pages.

Duisters et al., "A-90-dB THD Rail-to-Rail Input Opamp Using a New Local Charge Pump in CMOS" IEEE Journal of Solid-State Circuits, vol. 33, No. 7, Jul. 1998 in 9 pages.

Liu et al., "A High-Temperature Comparator with Rail-to-Rail Input Voltage Range" IEEE, Aug. 2013, in 4 pages.

Extended European Search Report for International Application No. 21174067.5 dated Oct. 18, 2021, in 13 pages.

* cited by examiner

AMPLIFIERS WITH WIDE INPUT RANGE AND LOW INPUT CAPACITANCE

FIELD OF THE DISCLOSURE

Embodiments of the invention relate to electronic systems, and more particularly, to amplifiers.

BACKGROUND

Certain electronic devices employ amplifiers for amplifying and/or otherwise processing signals. When operating open loop, such amplifiers receive an input signal and generate an output signal having a gain in comparison to the input signal. Examples of amplifiers include, but are not limited to, operational amplifiers, transimpedance amplifiers, and transconductance amplifiers. Certain amplifiers are implemented in a multi-stage configuration to enhance gain and/or performance thereof.

SUMMARY OF THE DISCLOSURE

Amplifiers with wide input range and low input capacitance are provided. In certain embodiments, an amplifier input stage includes a pair of input terminals, a pair of n-type input transistors, a first pair of isolation switches connected between the input terminals and the n-type input transistors, a pair of p-type input transistors, and a second pair of isolation switches connected between the input terminals and the p-type input transistors. The amplifier input stage further includes a control circuit that determines whether to use the n-type input transistors and/or the p-type input transistors for amplification based on a detected common-mode voltage of the input terminals. The control circuit opens the first pair of isolation switches to decouple the input terminals from the n-type input transistors when unused, and opens the second pair of isolation switches to decouple the input terminals from the p-type input transistors when unused. Implementing the amplifier input stage in this manner provides a number of advantages including, but not limited to, wide input range and low input capacitance.

In one aspect, an amplifier input stage having wide input range and low input capacitance is provided. The amplifier input stage includes a pair of input terminals configured to receive a differential input signal, a pair of n-type input transistors, a pair of p-type input transistors, a first pair of isolation switches connected between the pair of n-type input transistors and the pair of input terminals, a second pair of isolation switches connected between the pair of p-type input transistors and the pair of input terminals, and a control circuit configured to select at least one of the pair of n-type input transistors or the pair of p-type input transistors to amplify the differential input signal based on an input common-mode voltage of the pair of input terminals. The control circuit is further configured to open the first pair of isolation switches when the pair of n-type input transistors is not selected, and to open the second pair of isolation switches when the pair of p-type input transistors is not selected.

In another aspect, a method of amplification with wide input range and low input capacitance is provided. The method includes receiving a differential input signal between a pair of input terminals, selecting a pair of n-type input transistors or a pair of p-type input transistors for amplifying the differential input signal based on an input common-mode voltage of the pair of input terminals, opening a first pair of isolation switches to decouple the pair of n-type input transistors from the pair of input terminals when the pair of n-type input transistors is not selected, and opening a second pair of isolation switches to decouple the pair of p-type input transistors from the pair of input terminals when the pair of p-type input transistors is not selected.

In another aspect, an amplifier is provided. The amplifier includes a pair of input terminals configured to receive a differential input signal and having an input common-mode voltage, and an amplifier input stage including a pair of n-type input transistors, a pair of p-type input transistors, a first pair of isolation switches connected between the pair of n-type input transistors and the pair of input terminals, a second pair of isolation switches connected between the pair of p-type input transistors and the pair of input terminals, and a control circuit configured to open the first pair of isolation switches and close the second pair of isolation switches over a first range of the input common-mode voltage, and to open the second pair of isolation switches and close the first pair of isolation switches over a second range of the input common-mode voltage.

DETAILED DESCRIPTION OF EMBODIMENTS

The following detailed description of embodiments presents various descriptions of specific embodiments of the invention. However, the invention can be embodied in a multitude of different ways. In this description, reference is made to the drawings where like reference numerals may indicate identical or functionally similar elements. It will be understood that elements illustrated in the figures are not necessarily drawn to scale. Moreover, it will be understood that certain embodiments can include more elements than illustrated in a drawing and/or a subset of the elements illustrated in a drawing. Further, some embodiments can incorporate any suitable combination of features from two or more drawings.

Amplifiers with wide input range and low input capacitance are provided. In certain embodiments, an amplifier input stage includes a pair of input terminals, a pair of n-type input transistors, a first pair of isolation switches connected between the pair of input terminals and the pair of n-type input transistors, a pair of p-type input transistors, and a second pair of isolation switches connected between the pair of input terminals and the pair of p-type input transistors. The amplifier input stage further includes a control circuit that determines whether to use the n-type input transistors and/or the p-type input transistors for amplification based on a detected common-mode voltage of the input terminals. The control circuit opens the first pair of isolation switches to decouple the input terminals from the n-type input transistors when unused, and opens the second pair of isolation switches to decouple the input terminals from the p-type input transistors when unused.

Implementing the amplifier input stage in this manner provides a number of advantages including, but not limited to, wide input range and low input capacitance. For example, the control circuit can use the n-type input transistors at high input common-mode voltage and use the p-type input transistors at low input common-mode voltage, thereby providing a rail-to-rail input stage having an input common-mode voltage range extending from a power high supply voltage to a power low supply voltage (for instance, ground). Additionally, the control circuit uses the first and second pairs of isolation switches to decouple any unused input transistors from the input terminals, thereby reducing input capacitive loading.

In certain implementations, the control circuit also controls a bias current of the n-type input transistors and a bias current of the p-type input transistors. Additionally, the control circuit decreases the bias current of (for instance, fully turns off) any unused input transistors to reduce power consumption. Thus, the amplifier input stages herein can also operate with low power dissipation.

In certain implementations, the amplifier input stage further includes a first pair of common-mode bias switches for controlling a common-mode input voltage of the pair of n-type input transistors when unused, and a second pair of common-mode bias switches for controlling a common-mode input voltage of the pair of p-type input transistors when unused. In certain implementations, different common-mode input voltages are used for biasing the n-type input transistors and the p-type input transistors when deactivated. For example, the input common-mode voltages can correspond to threshold voltages of a hysteretic comparator of the control circuit such that the n-type input transistors and p-type input transistors are pre-charged to the voltage level at which each of the input transistors is activated. Accordingly, little to no input current flows when enabling a particular pair of input transistors for use.

The transistors can be implemented in a wide variety of ways. In certain implementations, the pair of n-type input transistors, the pair of p-type input transistors, and the first and second pairs of isolation switches correspond to field-effect transistors (FETs), such as metal-oxide-semiconductor (MOS) transistors. MOS transistors can be associated with a wide variety of manufacturing processes including not only bulk complementary MOS (CMOS) processes, but also triple well CMOS processes, silicon on insulator (SOI) processes, double-diffused MOS (DMOS) processes, as well as a wide range of other manufacturing processes.

In certain implementations, the first pair of isolation switches are p-type MOS (PMOS) transistors, the pair of n-type input transistors are n-type MOS (NMOS) transistors, the second pair of isolation switches are NMOS transistors, and the pair of p-type input transistors are PMOS transistors. Thus, a pair of isolation switches can have complementary device polarity with respect to the corresponding pair of input transistors they are coupled to. In certain implementations, voltage regulators are used to generate separate regulated voltages for a driver circuit of the first pair of isolation switches and a driver circuit of the second pair of isolation switches. Including voltage regulators in this manner aids in achieving suitable ON state and OFF state voltages for each pair of isolation switches. Moreover, the ON state and OFF state voltages can dynamically change in response to the input common-mode voltage.

In certain implementations, the amplifier input stage is included in an amplifier to serve as an input stage. Additionally, the amplifier includes one more additional stages, for instance, a cascade of the input stage with one or more additional stages.

Figure 1:
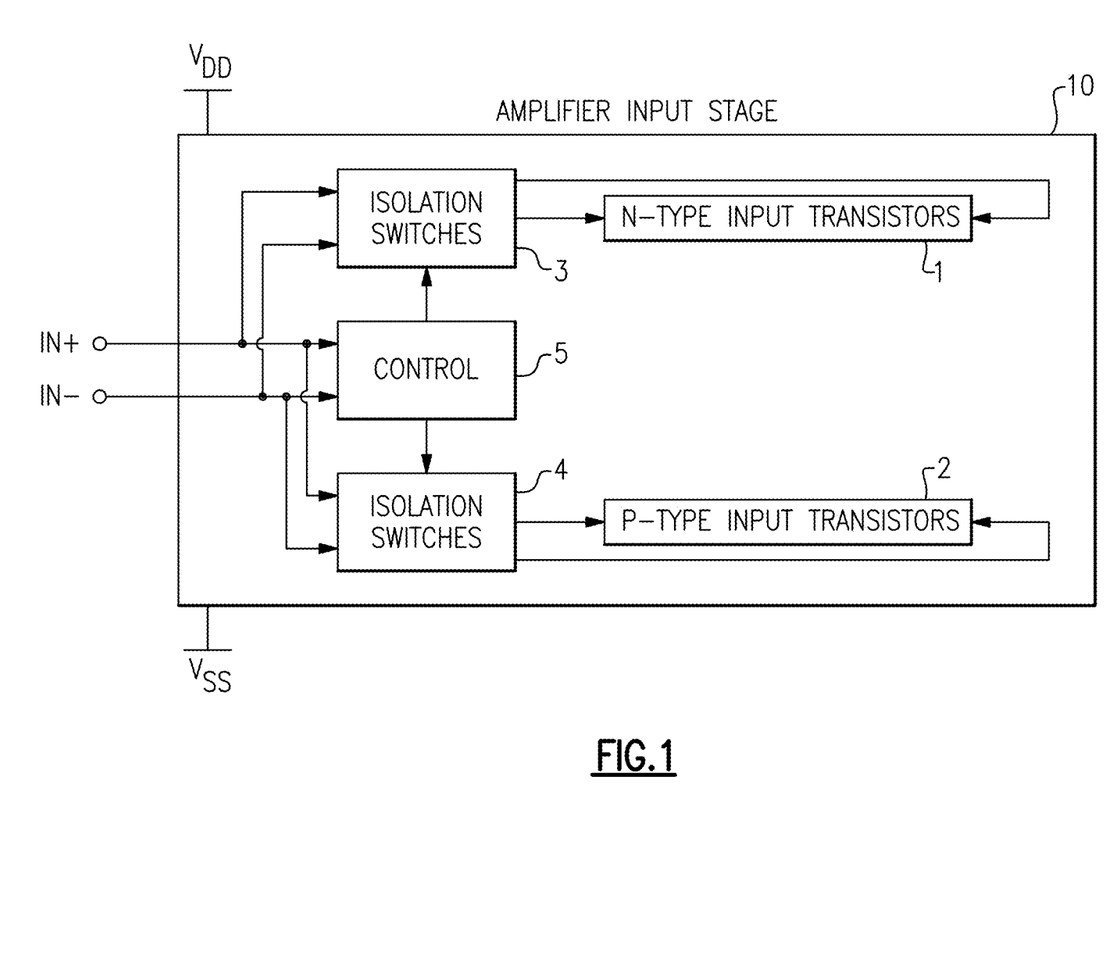
FIG. 1 is a schematic diagram of an amplifier input stage according to one embodiment.

FIG. 1 is a schematic diagram of an amplifier input stage 10 according to one embodiment. The amplifier input stage 10 includes a pair of n-type input transistors 1, a pair of p-type input transistors 2, a first pair of isolation switches 3, a second pair of isolation switches 4, and a control circuit 5. The amplifier input stage 10 further includes a pair of input terminals including a non-inverted input terminal IN+ and an inverted input terminal IN−. The amplifier input stage 10 is powered by a power high supply voltage $V_{DD}$ and a power low supply voltage $V_{SS}$.

As shown in FIG. 1, the first pair of isolation switches 3 is interposed between the pair of n-type input transistors 1 and the pair of input terminals (IN+, IN−). Additionally, the second pair of isolation switches 4 is interposed between the pair of p-type input transistors 2 and the pair of input terminals (IN+, IN−).

The first pair of isolation switches 3 is operable in a closed or ON state in which the pair of input terminals (IN+, IN−) is coupled to the pair of n-type input transistors 1, and an opened or OFF state in which the pair of input terminals (IN+, IN−) is decoupled from the pair of n-type input transistors 1 to reduce input capacitance. Similarly, the second pair of isolation switches 4 can be closed to couple the pair of input terminals (IN+, IN−) to the pair of p-type input transistors 2, or opened to decouple the pair of input terminals (IN+, IN−) from the pair of p-type input transistors 2 to reduce input capacitance.

In the illustrated embodiment, the control circuit 5 is coupled to the pair of input terminals (IN+, IN−) to sense an input common-mode voltage of the amplifier input stage 10. Based on the sensed input common-mode voltage, the control circuit 5 determines whether to use the pair of n-type input transistors 1 and/or the pair of p-type input transistors 2 to amplify a differential input signal received between the pair of input terminals (IN+, IN−).

For example, due to limitations arising from supply voltage headroom, the pair of n-type input transistors 1 is well-suited for providing amplification at high input common-mode voltage (for instance, near $V_{DD}$), while the pair of p-type input transistors 2 is well-suited for providing amplification at low input common-mode voltage (for instance, near $V_{SS}$).

Accordingly, in certain implementations, the control circuit 5 activates the pair of n-type input transistors 1 and deactivates the pair of p-type input transistors 2 when the detected input common-mode voltage is high, and activates the pair of p-type input transistors 2 and deactivates the pair of n-type input transistors 1 when the detected input common-mode voltage is low. For a middle band of input common-mode voltage, the control circuit 5 can activate either or both of the n-type input transistors 1 and p-type input transistors 2, based on implementation.

In the illustrated embodiment, the control circuit 5 opens the first pair of isolation switches 3 to decouple the input terminals (IN+, IN−) from the pair of the n-type input transistors 1 when unused, and opens the second pair of isolation switches 4 to decouple the input terminals (IN+, IN−) from the pair of p-type input transistors 2 when unused.

By implementing the amplifier input stage 10 in this manner, an input capacitance of the amplifier input stage 10 is reduced.

Figure 2:
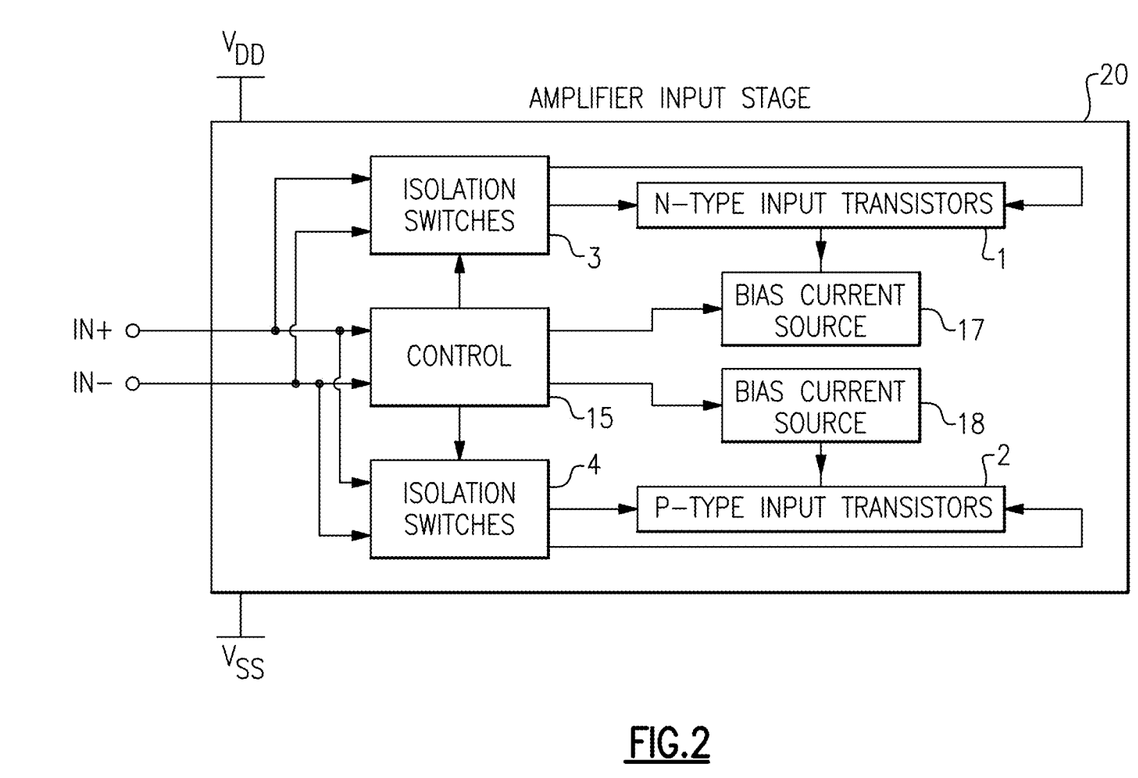
FIG. 2 is a schematic diagram of an amplifier input stage according to another embodiment.

FIG. 2 is a schematic diagram of an amplifier input stage 20 according to another embodiment. The amplifier input stage 20 includes a pair of n-type input transistors 1, a pair of p-type input transistors 2, a first pair of isolation switches 3, a second pair of isolation switches 4, a control circuit 15, a first bias current source 17, and a second bias current source 18. The amplifier input stage 20 further includes a pair of input terminals (IN+, IN−), and is powered by a power high supply voltage $V_{DD}$ and a power low supply voltage $V_{SS}$.

The amplifier input stage 20 of FIG. 2 is similar to the amplifier input stage 10 of FIG. 1, except that the amplifier input stage 20 of FIG. 2 further includes the first bias current source 17 for providing a first bias current to the pair of n-type input transistors 1 and the second bias current source 18 for providing a second bias current to the pair of p-type input transistors 2. Additionally, when the pair of n-type input transistors 1 is unused, the control circuit 15 controls the first bias current source 17 to decrease the first bias current (for instance, fully turn off). Furthermore, when the pair of p-type input transistors 2 is unused, the control circuit 15 controls the second bias current source 18 to decrease the second bias current (for instance, fully turn off).

Accordingly, the control circuit 15 decreases the bias current of any unused input transistors to reduce power consumption. Thus, the amplifier input stage 20 operates with low power dissipation. Any of the embodiments herein can include a control circuit that controls the bias current of n-type input transistors and/or p-type input transistors to decrease power consumption when any input transistors are unused.

Figure 3:
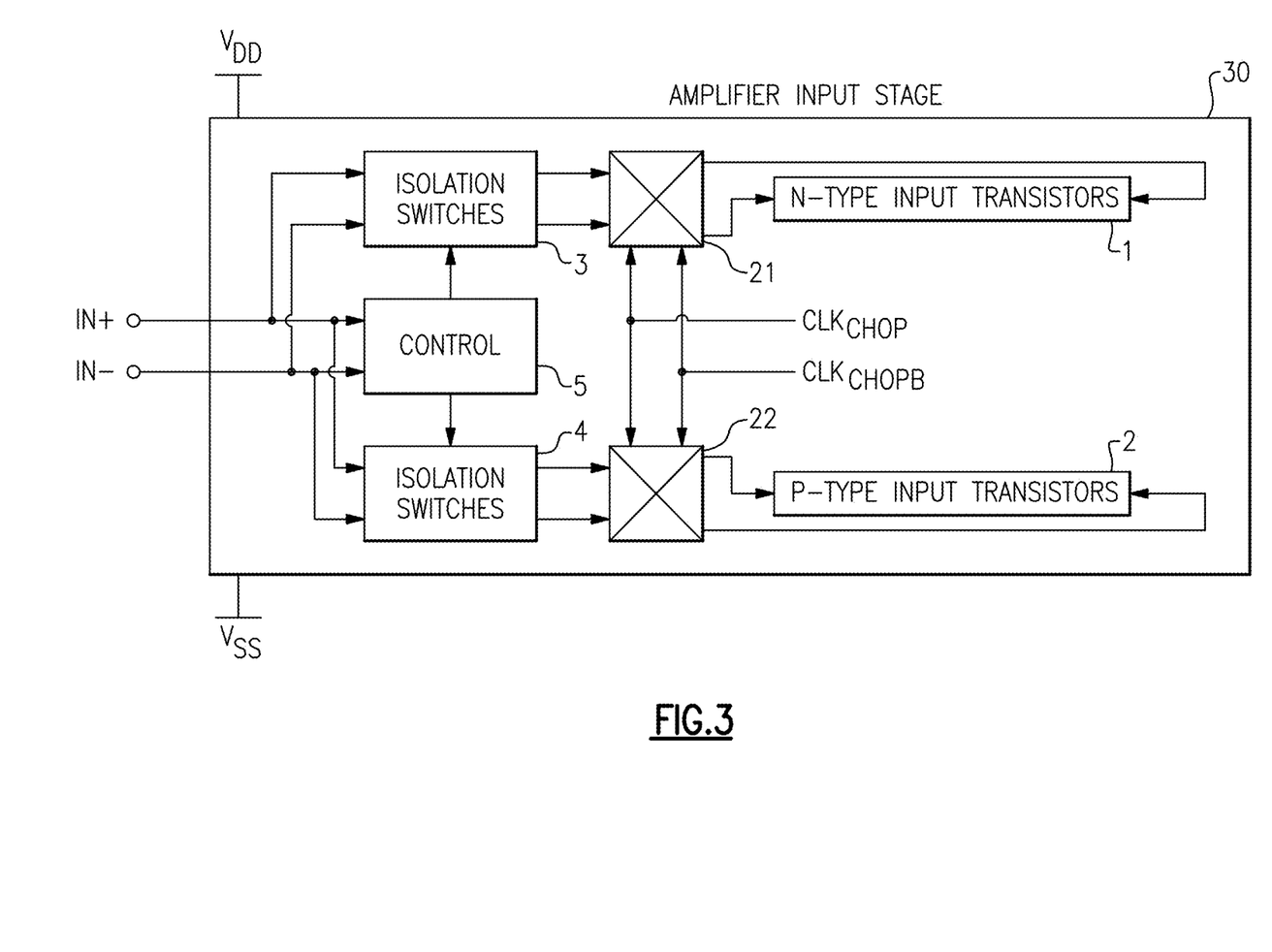
FIG. 3 is a schematic diagram of an amplifier input stage according to another embodiment.

FIG. 3 is a schematic diagram of an amplifier input stage 30 according to another embodiment. The amplifier input stage 30 includes a pair of n-type input transistors 1, a pair of p-type input transistors 2, a first pair of isolation switches 3, a second pair of isolation switches 4, a control circuit 5, a first input chopping circuit 21, and a second input chopping circuit 22. The amplifier input stage 30 further includes a pair of input terminals (IN+, IN−), and is powered by a power high supply voltage $V_{DD}$ and a power low supply voltage $V_{SS}$.

The amplifier input stage 30 of FIG. 3 is similar to the amplifier input stage 10 of FIG. 1, except that the amplifier input stage 30 of FIG. 3 further includes the first input chopping circuit 21 interposed between the first pair of isolation switches 3 and the pair of n-type input transistors 1, and the second input chopping circuit 22 interposed between the second pair of isolation switches 4 and the pair of p-type input transistors 2.

As shown in FIG. 3, the first input chopping circuit 21 and the second input chopping circuit 22 are controlled by a chopping clock signal $CLK_{CHOP}$ and an inverted chopping clock signal $CLK_{CHOPB}$, which is logically inverted relative to the chopping clock signal $CLK_{CHOP}$ (with or without non-overlap). In certain implementations, each of the first input chopping circuit 21 and the second input chopping circuit 22 includes a first chopping FET CONNECTED BETWEEN A FIRST INPUT AND A FIRST OUTPUT AND CONTROLLED BY $CLK_{CHOP}$, A SECOND chopping FET connected between a second input and a second output and controlled by $CLK_{CHOP}$, a third chopping FET connected between the first input and the second output and controlled by $CLK_{CHOPB}$, and a fourth chopping FET connected between the second input and the first output and controlled by $CLK_{CHOPB}$. However, other implementations are possible.

Implementing an amplifier with chopping compensates for an input offset voltage of the amplifier's differential pair. Although an example with chopping is depicted, other implementations of amplifier input offset voltage compensation are possible, including, but not limited to, auto-zeroing. Any of the amplifiers herein can be implemented with chopping, auto-zeroing, and/or other input offset voltage compensation schemes.

Figure 4:
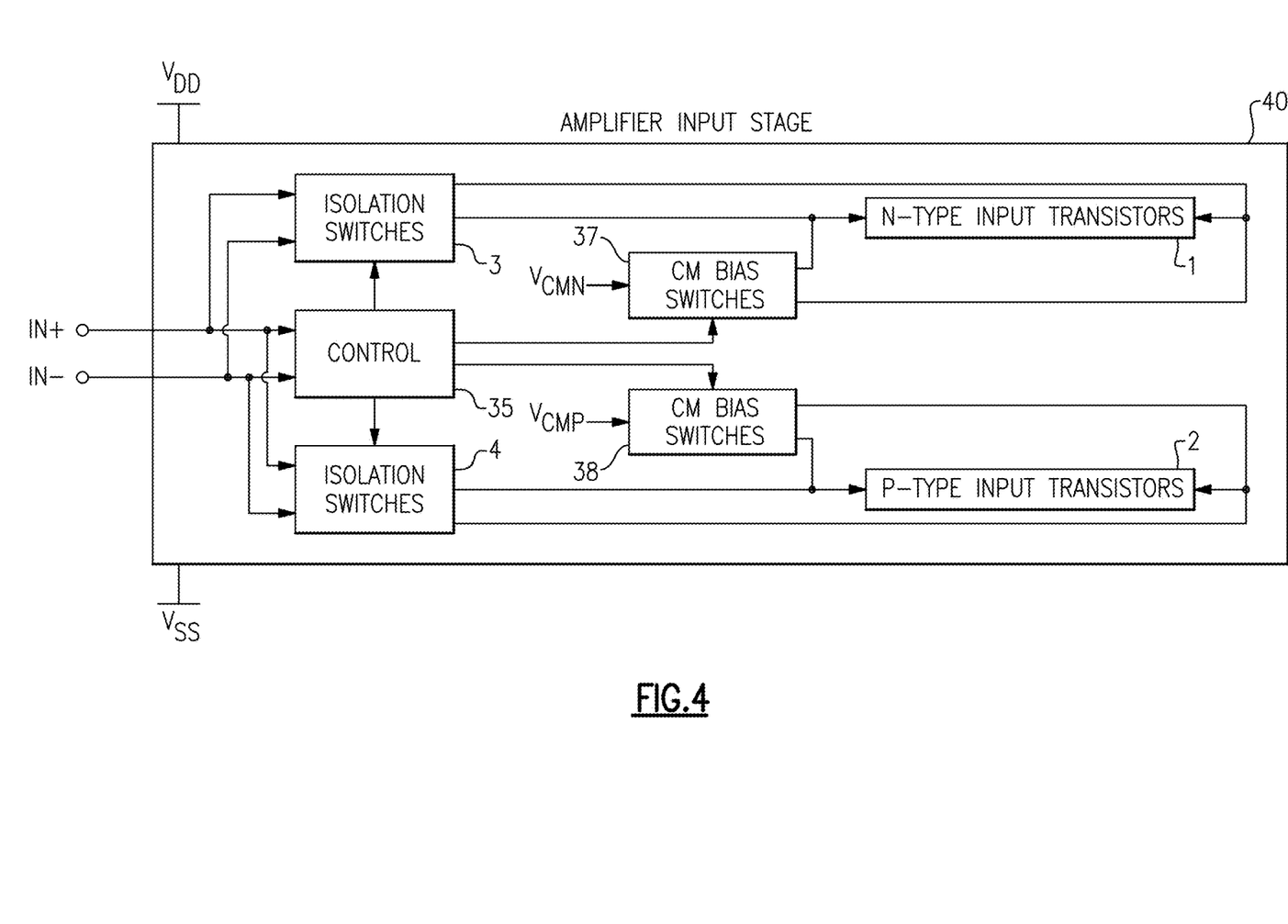
FIG. 4 is a schematic diagram of an amplifier input stage according to another embodiment.

FIG. 4 is a schematic diagram of an amplifier input stage 40 according to another embodiment. The amplifier input stage 40 includes a pair of n-type input transistors 1, a pair of p-type input transistors 2, a first pair of isolation switches 3, a second pair of isolation switches 4, a control circuit 35, a first pair of common-mode bias switches 37, and a second pair of common-mode bias switches 38. The amplifier input stage 40 further includes a pair of input terminals (IN+, IN−), and is powered by a power high supply voltage $V_{DD}$ and a power low supply voltage $V_{SS}$.

The amplifier input stage 40 of FIG. 4 is similar to the amplifier input stage 10 of FIG. 1, except that the amplifier input stage 40 of FIG. 4 further includes the first pair of common-mode bias switches 37 connected between a first common-mode voltage $V_{CMN}$ and the pair of n-type input transistors 1, and the second pair of common-mode bias switches 38 connected between a second common-mode voltage $V_{CMP}$ and the pair of p-type input transistors 2.

As shown in FIG. 4, the control circuit 35 controls not only the first pair of isolation switches 3 and the pair of isolation switches 4, but also the first pair of common-mode bias switches 37 and the second pair of common-mode bias switches 38.

When the pair of n-type input transistors 1 is being used, the control circuit 35 closes the first pair of isolation switches 3 and opens the first pair of common-mode bias switches 37. Additionally, when the pair of n-type input transistors 1 is not being used, the control circuit 35 opens the first pair of isolation switches 3 and closes the first pair of common-mode bias switches 37, thereby biasing the pair of n-type input transistors 1 with the first common-mode voltage $V_{CMN}$. When the pair of p-type input transistors 2 is being used, the control circuit 35 closes the second pair of isolation switches 3 and opens the second pair of common-mode bias switches 38. Additionally, when the pair of p-type input transistors 2 is not being used, the control circuit 35 opens the second pair of isolation switches 4 and closes the second pair of common-mode bias switches 38, thereby biasing the pair of p-type input transistors 2 with the second common-mode voltage $V_{CMP}$.

Accordingly, the first common-mode voltage $V_{CMN}$ and the second common-mode voltage $V_{CMP}$ are used to bias the pair of n-type input transistors 1 and the pair of p-type input transistors 2, respectively, when unused. The first common-mode voltage $V_{CMN}$ and the second common-mode voltage $V_{CMP}$ can be the same or different voltage level.

Figure 5A:
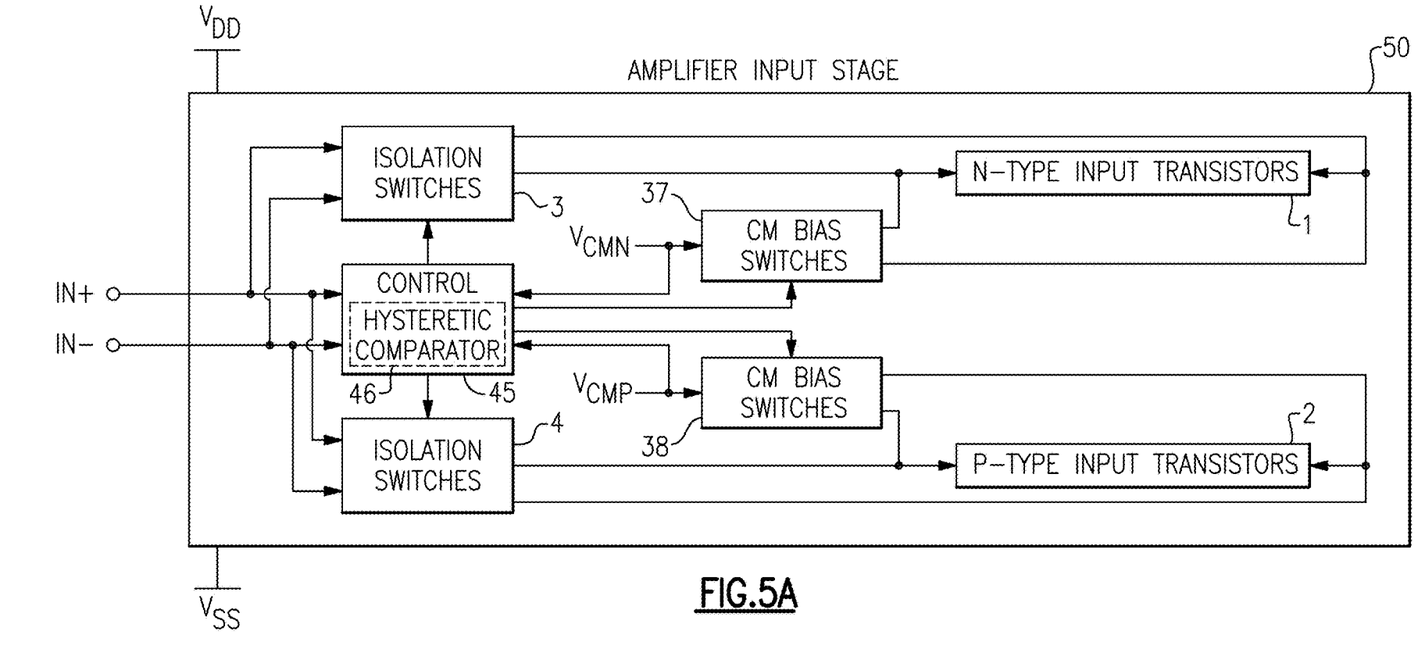
FIG. 5A is a schematic diagram of an amplifier input stage according to another embodiment.

FIG. 5A is a schematic diagram of an amplifier input stage 50 according to another embodiment. The amplifier input stage 50 includes a pair of n-type input transistors 1, a pair of p-type input transistors 2, a first pair of isolation switches 3, a second pair of isolation switches 4, a control circuit 45, a first pair of common-mode bias switches 37, and a second pair of common-mode bias switches 38. The amplifier input stage 50 further includes a pair of input terminals (IN+, IN−), and is powered by a power high supply voltage $V_{DD}$ and a power low supply voltage $V_{SS}$.

The amplifier input stage 50 of FIG. 5A is similar to the amplifier input stage 40 of FIG. 4, except that the control circuit 45 of FIG. 5A includes a hysteretic comparator 46. The hysteretic comparator 46 compares the input common-mode voltage of the input terminals (IN+, IN−) to an upper trigger voltage and a lower trigger voltage to determine which pair of input transistors to use. Relative to an implementation with a comparator operating with a single trigger voltage, using hysteresis inhibits repeated changes in the selection of the input transistors when the input common-mode voltage hovers around a transition point for selecting which input transistors to use.

Figure 5B:
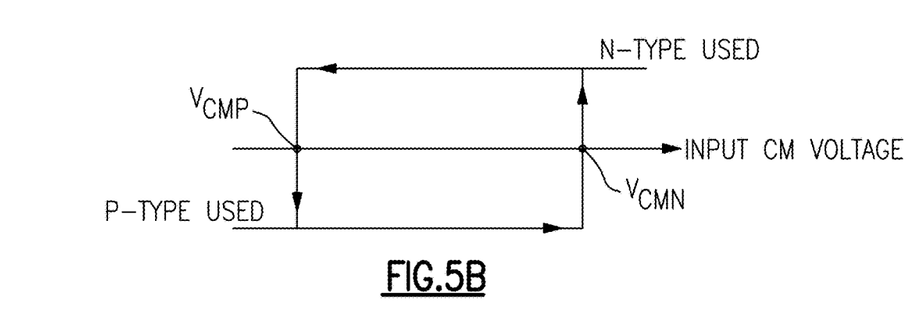
FIG. 5B is a graph of one example of trigger voltages for a hysteretic comparator.

FIG. 5B is a graph of one example of trigger voltages for the hysteretic comparator 46 of FIG. 5A.

In the example of FIG. 5B, the hysteretic comparator 46 controls a transition from using the p-type input transistors 2 to using the n-type input transistors 1 when the input common-mode voltage is greater than the first common-mode voltage $V_{CMN}$. Since the n-type input transistors 1 are pre-charged to the first common-mode voltage $V_{CMN}$ in this example, little to no input current flows when activating the n-type input transistors 1.

With continuing reference to the example of FIG. 5B, the hysteretic comparator 46 controls a transition from using the n-type input transistors 1 to using the p-type input transistors 2 when the input common-mode voltage is less than the second common-mode voltage $V_{CMP}$. Since the p-type input transistors 2 are pre-charged to the second common-mode voltage $V_{CMP}$ in this example, little to no input current flows when activating the p-type input transistors 2.

Figure 6:
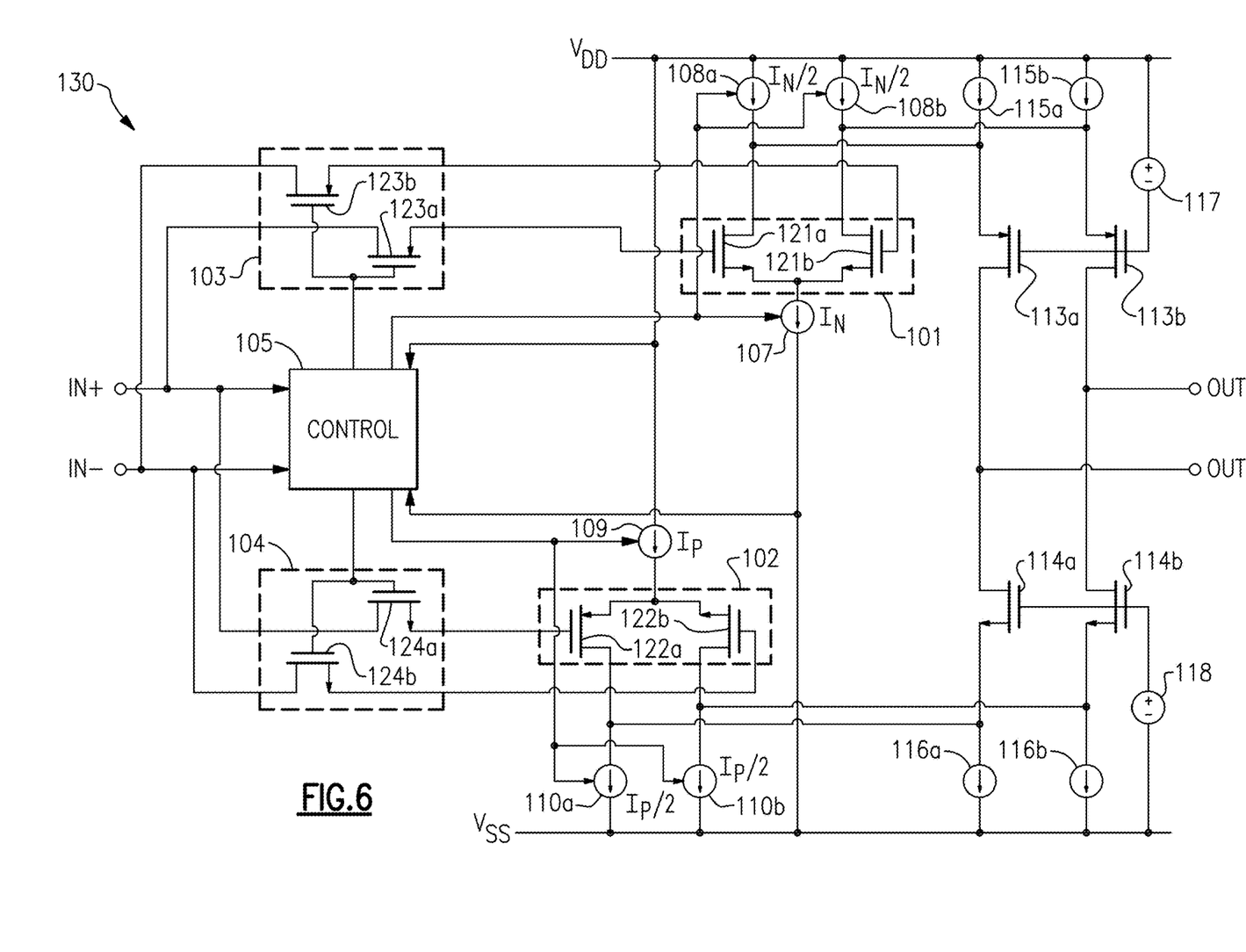
FIG. 6 is a schematic diagram of an amplifier input stage according to another embodiment.

FIG. 6 is a schematic diagram of an amplifier input stage 130 according to another embodiment. The amplifier input stage 130 includes a pair of NMOS input transistors 101, a pair of PMOS input transistors 102, a pair of PMOS isolation switches 103, a pair of NMOS isolation switches 104, a control circuit 105, a first group of current sources 107, 108a, and 108b, a second group of current sources 109, 110a, and 110b, a first cascode PMOS transistor 113a, a second cascode PMOS transistors 113b, a first cascode NMOS transistor 114a, a second cascode NMOS transistor 114b, a third group of current sources 115a and 115b, a fourth group of current sources 116a and 116b, a first voltage source 117, and a second voltage source 118. The amplifier input stage 130 further includes a pair of input terminals (IN+, IN−) and a pair of output terminals (OUT+, OUT−), and is powered by a power high supply voltage $V_{DD}$ and a power low supply voltage $V_{SS}$.

In the illustrated embodiment, the pair of NMOS input transistors 101 is implemented as a differential transistor pair including a first NMOS input transistor 121a and a second NMOS input transistor 121b, which each include a source connected to one another and biased with a common bias current IN from the current source 107. Additionally, the drain of the first NMOS input transistor 121a is biased by a bias current $I_N/2$ from the current source 108a and the drain of the second NMOS input transistor 121b is biased by a bias current $I_N/2$ from the current source 108b.

The pair of PMOS isolation switches 103 include a first PMOS isolation switch 123a and a second PMOS isolation switch 123b. The drains of the PMOS isolation switches 123a-123b are connected to IN+ and IN−, respectively, while the sources of the PMOS isolation switches 123a-123b are connected to the gates of the NMOS input transistors 121a-121b, respectively. The gates of the PMOS isolation switches 123a-123b are controlled by the control circuit 105.

With continuing reference to FIG. 6, the pair of PMOS input transistors 102 are implemented as a differential transistor pair including a first PMOS input transistor 122a and a second PMOS input transistor 122b, which each include a source connected to one another and biased with a common bias current $I_P$ from the current source 109. Additionally, the drain of the first PMOS input transistor 122a is biased by a bias current $I_P/2$ from the current source 110a and the drain of the second PMOS input transistor 122b is biased by a bias current $I_P/2$ from the current source 110b.

The pair of NMOS isolation switches 104 include a first NMOS isolation switch 124a and a second NMOS isolation switch 124b. The drains of the NMOS isolation switches 124a-124b are connected to IN+ and IN−, respectively, while the sources of the NMOS isolation switches 124a-124b are connected to the gates of the PMOS input transistors 122a-122b, respectively. The gates of the NMOS isolation switches 124a-124b are controlled by the control circuit 105.

In the illustrated embodiment, the control circuit 105 is coupled to the pair of input terminals (IN+, IN−) to sense an input common-mode voltage. Based on the sensed input common-mode voltage, the control circuit 105 selects the pair of NMOS input transistors 101 and/or the pair of PMOS input transistors 102 for amplification of the differential input signal received between IN+ and IN−.

When the pair of NMOS input transistors 101 are being used, the control circuit 105 turns on the pair of PMOS isolation transistors 103 and turns on the first group of current sources 107, 108a, and 108b. However, when the pair of NMOS input transistors 101 are not being used, the control circuit 105 turns off the pair of PMOS isolation transistors 103 and turns off the first group of current sources 107, 108a, and 108b.

With continuing reference to FIG. 6, when the pair of PMOS input transistors 102 are being used, the control circuit 105 turns on the pair of NMOS isolation transistors 104 and turns on the second group of current sources 109, 110a, and 110b. However, when the pair of PMOS transistors 102 are not being used, the control circuit 105 turns off the pair of NMOS isolation transistors 104 and turns off the second group of current sources 109, 110a, and 110b.

An example of folded cascode circuitry is depicted as being coupled to the pair of NMOS input transistors 101 and the pair of PMOS input transistors 102. The folded cascode circuitry illustrates one example of circuitry suitable for providing the output signal from the pair of NMOS input transistors 101 and the output signal from the pair of PMOS input transistors 102 to a common pair of output terminals (OUT+, OUT−). However, other implementations of circuitry are possible.

Figure 7:
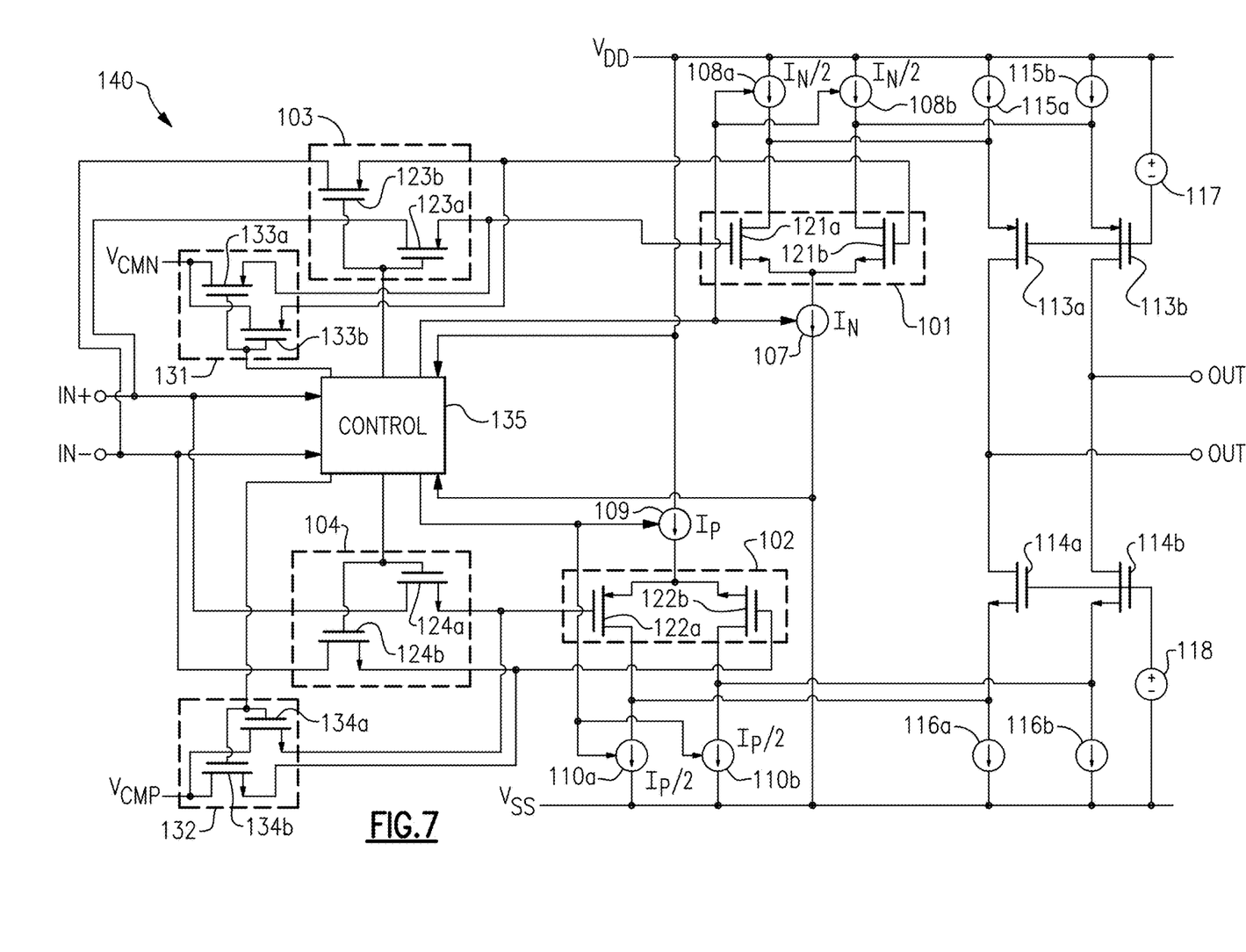
FIG. 7 is a schematic diagram of an amplifier input stage according to another embodiment.

FIG. 7 is a schematic diagram of an amplifier input stage 140 according to another embodiment. The amplifier input stage 140 of FIG. 7 is similar to the amplifier input stage 130 of FIG. 6, except that the amplifier input stage 140 further includes a pair of PMOS common-mode bias transistors 131 and a pair of NMOS common-mode bias transistors 132.

As shown in FIG. 7, the pair of PMOS common-mode bias switches 131 includes a first PMOS common-mode bias transistor 133a and a second PMOS common-mode bias transistor 133b, each of which has a drain connected to a first common-mode voltage $V_{CMN}$. Additionally, the sources of the PMOS common-mode bias transistors 133a-133b are connected to the gates of the NMOS input transistors 121a-121b, respectively. The gates of the PMOS common-mode bias transistors 133a-133b are controlled by the control circuit 135.

The pair of NMOS common-mode bias transistors 132 includes a first NMOS common-mode bias transistor 134a and a second NMOS common-mode bias transistor 134b, each of which has a drain connected to a second common-mode voltage $V_{CMP}$. Additionally, the sources of the NMOS common-mode bias transistors 134a-134b are connected to the gates of the PMOS input transistors 122a-122b, respectively. The gates of the NMOS common-mode bias transistors 134a-134b are controlled by the control circuit 135.

When the pair of NMOS input transistors 101 is being used, the control circuit 135 turns off the pair of PMOS common-mode bias transistors 131. However, when the pair of NMOS input transistors 101 is not being used, the control circuit 135 turns on the pair of PMOS common-mode bias transistors 131, thereby biasing the pair of NMOS input transistors 101 with the first common-mode bias voltage $V_{CMN}$.

When the pair of PMOS input transistors 102 is being used, the control circuit 135 turns off the pair of NMOS common-mode bias transistors 132. However, when the pair of PMOS input transistors 102 is not being used, the control circuit 135 turns on the pair of NMOS common-mode bias transistors 132, thereby biasing the pair of PMOS input transistors 102 with the second common-mode bias voltage $V_{CMP}$.

Figure 8:
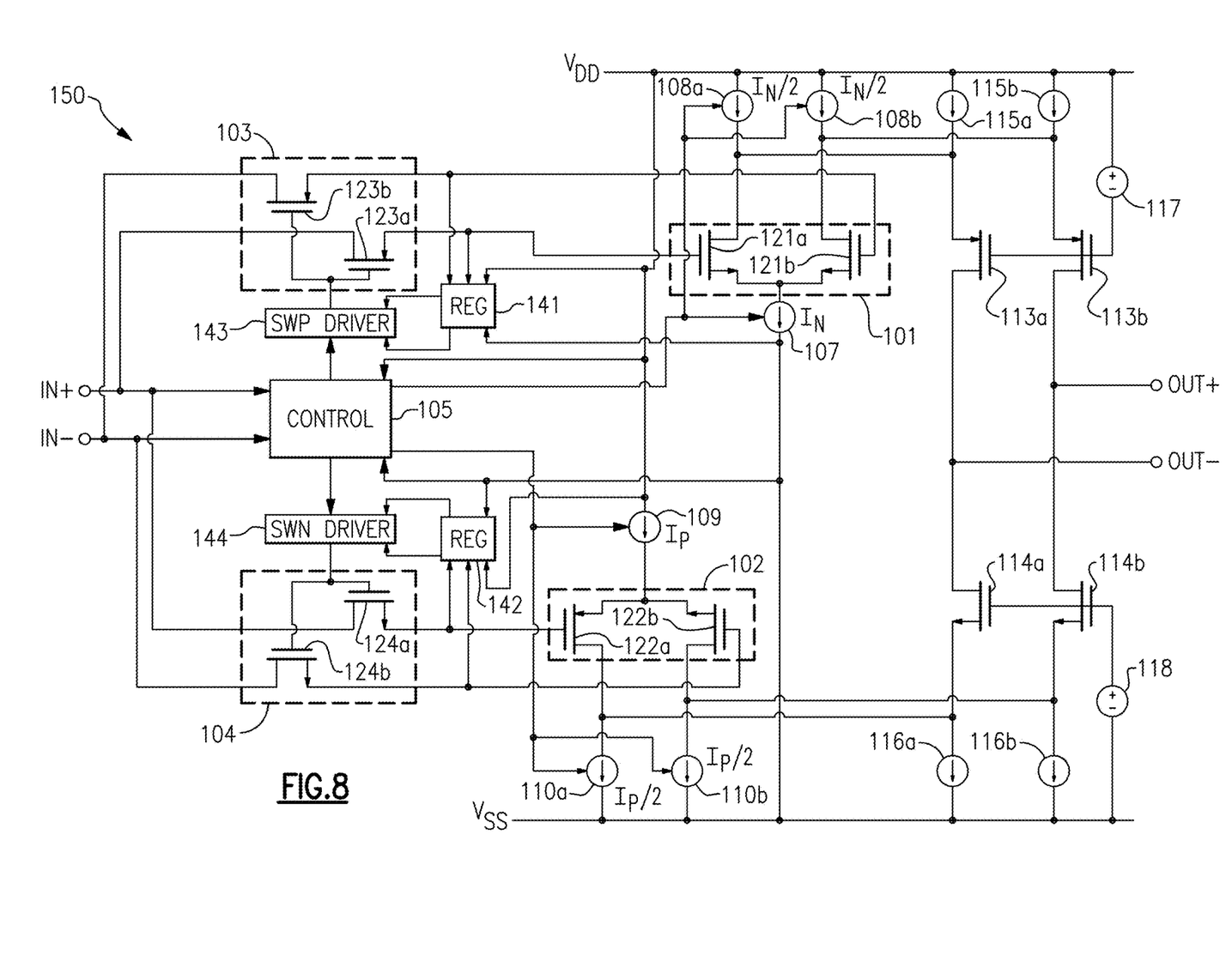
FIG. 8 is a schematic diagram of an amplifier input stage according to another embodiment.

FIG. 8 is a schematic diagram of an amplifier input stage 150 according to another embodiment. The amplifier input stage 150 of FIG. 8 is similar to the amplifier input stage 130 of FIG. 6, except that the amplifier input stage 150 further includes a first voltage regulator 141, a first switch driver 143, a second voltage regulator 142, and a second switch driver 144.

The first switch driver 143 is used to drive the pair of PMOS isolation transistors 103 based on a first control signal from the control circuit 105. The first voltage regulator 141 senses the common-mode voltage at the gates of the pair of NMOS input transistors 101 to generate a pair of regulated voltages for the first switch driver 143. The pair of regulated voltages set the turn on and turn off voltages for the pair of PMOS isolation transistors 103. Implementing the amplifier input stage 150 in this manner aids in providing suitable gate bias voltages for the pair of PMOS isolation transistors 103 as the input common-mode voltage changes.

With continuing reference to FIG. 8, the second switch driver 144 is used to drive the pair of NMOS isolation transistors 104 based on a second control signal from the control circuit 105. The second voltage regulator 142 senses the common-mode voltage at the gates of the pair of PMOS input transistors 102 to generate a pair of regulated voltages for the second switch driver 144.

Figure 9:
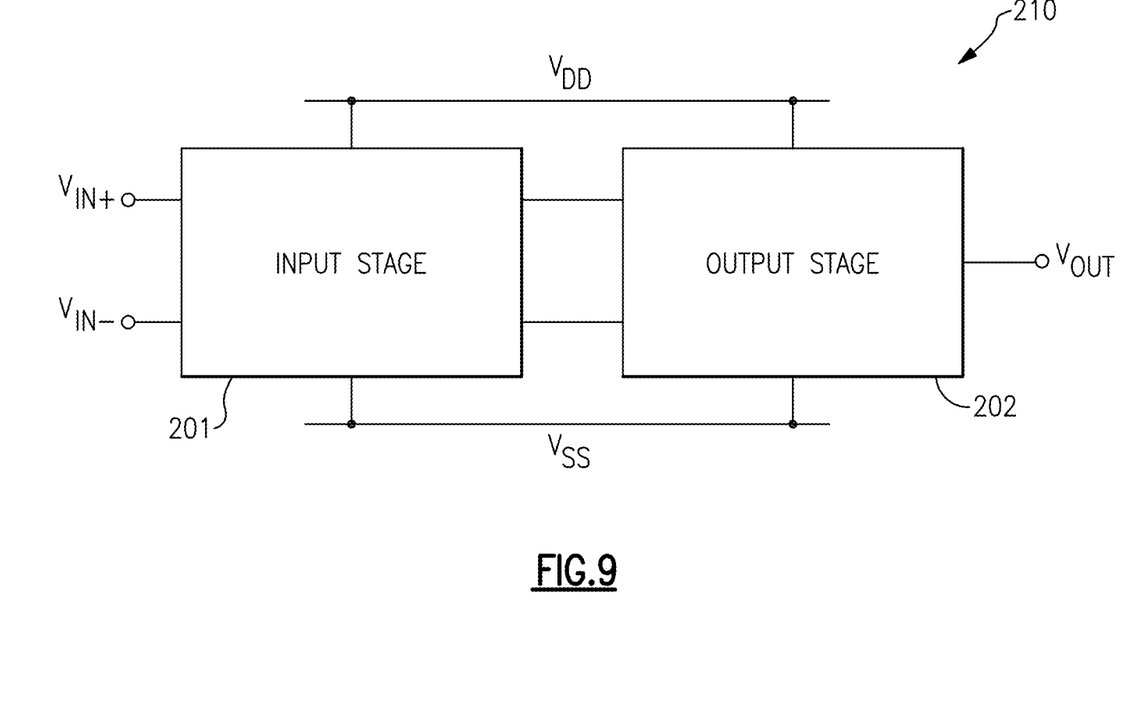
FIG. 9 is a schematic diagram of a multi-stage amplifier according to one embodiment.

FIG. 9 is a schematic diagram of a multi-stage amplifier 210 according to one embodiment. The amplifier 210 includes a pair of input voltage terminals ($V_{IN+}$, $V_{IN-}$), an input stage 201, an output stage 202, and an output voltage terminal $V_{OUT}$. The amplifier 210 is powered by a power high supply voltage $V_{DD}$ and a power low supply voltage $V_{SS}$. The input stage 201 can be implemented in accordance with any of the embodiments herein.

Although one embodiment of an amplifier is depicted, the amplifier input stages herein can be incorporated into a wide variety of types of amplifiers. Such amplifier can include more or fewer stages, different types of stages, and/or terminals of other numbers and/or types. Accordingly, although a two stage amplifier providing a single-ended output voltage is depicted, the teachings herein are applicable to amplifiers implemented in a wide variety of ways.

CONCLUSION

The foregoing description may refer to elements or features as being "connected" or "coupled" together. As used herein, unless expressly stated otherwise, "connected" means that one element/feature is directly or indirectly connected to another element/feature, and not necessarily mechanically. Likewise, unless expressly stated otherwise, "coupled" means that one element/feature is directly or indirectly coupled to another element/feature, and not necessarily mechanically. Thus, although the various schematics shown in the figures depict example arrangements of elements and components, additional intervening elements, devices, features, or components may be present in an actual embodiment (assuming that the functionality of the depicted circuits is not adversely affected).

While certain embodiments have been described, these embodiments have been presented by way of example only, and are not intended to limit the scope of the disclosure. Indeed, the novel apparatus, methods, and systems described herein may be embodied in a variety of other forms; furthermore, various omissions, substitutions and changes in the form of the methods and systems described herein may be made without departing from the spirit of the disclosure. For example, while the disclosed embodiments are presented in a given arrangement, alternative embodiments may perform similar functionalities with different components and/or circuit topologies, and some elements may be deleted, moved, added, subdivided, combined, and/or modified. Each of these elements may be implemented in a variety of different ways. Any suitable combination of the elements and acts of the various embodiments described above can be combined to provide further embodiments. Accordingly, the scope of the present invention is defined only by reference to the appended claims.

Although the claims presented here are in single dependency format for filing at the USPTO, it is to be understood that any claim may depend on any preceding claim of the same type except when that is clearly not technically feasible.

What is claimed is:

1. An amplifier input stage having wide input range and low input capacitance, the amplifier input stage comprising:
a pair of input terminals configured to receive a differential input signal;
a pair of n-type input transistors, and a pair of p-type input transistors including a first p-type input transistor and a second p-type input transistor;
a first pair of isolation switches connected between the pair of n-type input transistors and the pair of input terminals, and a second pair of isolation switches connected between the pair of p-type input transistors and the pair of input terminals; and
a control circuit configured to select at least one of the pair of n-type input transistors or the pair of p-type input transistors to amplify the differential input signal based on an input common-mode voltage of the pair of input terminals, wherein the control circuit is further configured to open the first pair of isolation switches when the pair of n-type input transistors is not selected, and to open the second pair of isolation switches to disconnect both the first p-type input transistor and the second p-type input transistor from the pair of input terminals when the pair of p-type input transistors is not selected.

2. The amplifier input stage of claim 1, further comprising a first pair of common-mode bias switches configured to provide a first common-mode bias voltage to the pair of n-type input transistors when the first pair of isolation switches are opened, and a second pair of common-mode bias switches configured to provide a second common-mode bias voltage to the pair of p-type input transistors when the second pair of isolation switches are opened.

3. The amplifier input stage of claim 2, wherein the first common-bias voltage and the second common-mode bias voltage have different voltage levels.

4. The amplifier input stage of claim 3, wherein the control circuit is configured to transition from selecting the pair of p-type input transistors to selecting the pair of n-type input transistors when the input common-mode voltage is greater than the first common-mode bias voltage, and wherein the control circuit is further configured to transition from selecting the pair of n-type input transistors to selecting the pair of p-type input transistors when the input common-mode voltage is less than the second common-mode bias voltage.

5. The amplifier input stage of claim 1, further comprising a first bias current source configured to bias the pair of n-type input transistors and a second bias current source configured to bias the pair of p-type input transistors, wherein the control circuit is further configured to turn off the first bias current source when the pair of n-type input transistors is not selected, and to turn off the second bias current source when the pair of p-type input transistors is not selected.

6. The amplifier input stage of claim 1, wherein the control circuit is further configured to select the pair of n-type input transistors and not select the pair of p-type input transistors over an upper range of the input common-mode voltage, and to select the pair of p-type input transistors and not select the pair of n-type input transistors over a lower range of the input common-mode voltage.

7. The amplifier input stage of claim 1, further comprising a first switch driver configured to open or close the first pair of isolation switches, and a first voltage regulator configured to generate a first pair of regulated voltages for the first switch driver based on sensing a common-mode voltage of the pair of n-type input transistors.

8. The amplifier input stage of claim 7, further comprising a second switch driver configured to open or close the second pair of isolation switches, and a second voltage regulator configured to generate a second pair of regulated voltages for the second switch driver based on sensing a common-mode voltage of the pair of p-type input transistors.

9. The amplifier input stage of claim 1, further comprising a first input chopping circuit connected between the first pair of isolation switches and the pair of n-type input transistors, and a second input chopping circuit connected between the second pair of isolation switches and the pair of p-type input transistors.

10. The amplifier input stage of claim 1, wherein the pair of n-type input transistors includes a first n-type metal-oxide-semiconductor (NMOS) transistor and a second NMOS transistor each having a source connected to one another, and wherein the pair of p-type input transistors includes a first p-type metal-oxide-semiconductor (PMOS) transistor and a second PMOS transistor each having a source connected to one another.

11. The amplifier input stage of claim 1, wherein the first pair of isolation switches comprise a pair of p-type transistors, and wherein the second pair of isolation switches comprise a pair of n-type transistors.

12. The amplifier input stage of claim 1, further comprising folded cascode circuitry configured to combine a first output signal from the pair of n-type input transistors and a second output signal from the pair of p-type input transistors.

13. A method of amplification with wide input range and low input capacitance, the method comprising:
receiving a differential input signal between a pair of input terminals;
selecting a pair of n-type input transistors or a pair of p-type input transistors for amplifying the differential input signal based on an input common-mode voltage of the pair of input terminals, the pair of p-type input transistors including a first p-type input transistor and a second p-type input transistor;
opening a first pair of isolation switches to decouple the pair of n-type input transistors from the pair of input terminals when the pair of n-type input transistors is not selected; and
opening a second pair of isolation switches to decouple the pair of p-type input transistors including both the first p-type input transistor and the second p-type input transistor from the pair of input terminals when the pair of p-type input transistors is not selected.

14. The method of claim 13, further comprising biasing the pair of n-type input transistors with a first common-mode bias voltage when the first pair of isolation switches is opened, and biasing the pair of p-type input transistors with a second common-mode bias voltage when the second pair of isolation switches is opened.

15. The method of claim 14, wherein the first common-bias voltage and the second common-mode bias voltage have different voltage levels.

16. The method of claim 15, further comprising transitioning from selecting the pair of p-type input transistors to selecting the pair of n-type input transistors when the input common-mode voltage is greater than the first common-mode bias voltage, and transitioning from selecting the pair of n-type input transistors to selecting the pair of p-type input transistors when the input common-mode voltage is less than the second common-mode bias voltage.

17. The method of claim 14, further comprising turning off a bias current of the pair of n-type input transistors when the pair of n-type input transistors is not selected, and turning off a bias current of the pair of p-type input transistors when the pair of p-type input transistors is not selected.

18. The method of claim 14, further comprising opening or closing the first pair of isolation switches using a switch driver, and generating a pair of regulated voltages for the switch driver using a voltage regulator that senses a common-mode voltage of the pair of n-type input transistors.

19. An amplifier comprising:
a pair of input terminals configured to receive a differential input signal, wherein the pair of input terminals has an input common-mode voltage; and
an amplifier input stage comprising:
a pair of n-type input transistors, and a pair of p-type input transistors including a first p-type input transistor and a second p-type input transistor;
a first pair of isolation switches connected between the pair of n-type input transistors and the pair of input terminals, and a second pair of isolation switches connected between the pair of p-type input transistors and the pair of input terminals; and a control circuit configured to open the first pair of isolation switches and close the second pair of isolation switches over a first range of the input common-mode voltage, and to open the second pair of isolation switches and close the first pair of isolation switches over a second range of the input common-mode voltage, the control circuit further configured to disconnect both the first p-type input transistor and the second p-type input transistor from the pair of input terminals over the second range of the input common-mode voltage.

20. The amplifier of claim 19, further comprising an amplifier output stage configured to receive a combined signal that combines a first output signal from the pair of n-type input transistors and a second output signal from the pair of p-type input transistors.

* * * * *